US006150267A

United States Patent [19]

Chen

[11] Patent Number: 6,150,267

[45] Date of Patent: Nov. 21, 2000

[54] METHOD OF MANUFACTURING BURIED CONTACT IN SRAM

[75] Inventor: Ming I Chen, Tainan Hsien, Taiwan

[73] Assignee: United Microelectronics Corp., Hsinchu, Taiwan

[21] Appl. No.: 09/185,915

[22] Filed: Nov. 4, 1998

[51] Int. Cl.[7] ..................... H01L 21/44

[52] U.S. Cl. ..................... 438/683; 438/683

[58] Field of Search ..................... 438/238, 423, 438/440, 439, 443, 526, 528, 740, 743, 683; 437/26, 41, 347; 257/380

[56] References Cited

U.S. PATENT DOCUMENTS

| | | | |
|---|---|---|---|
| 5,525,552 | 6/1996 | Huang | 437/41 |
| 5,652,152 | 7/1997 | Pan et al. | 437/26 |
| 5,728,615 | 3/1998 | Cheng et al. | 438/238 |
| 5,751,043 | 5/1998 | You | 257/380 |
| 5,894,151 | 4/1999 | Yamazaki et al. | 257/347 |

*Primary Examiner*—David Nelms
*Assistant Examiner*—David Nhu
*Attorney, Agent, or Firm*—Hickman Coleman & Hughes, LLP

[57] ABSTRACT

A method of manufacturing buried contact window in SRAM includes implanting oxygen ions into a substrate inside a buried contact window region adjacent to the location for forming a source/drain region, and then carrying out oxidative reaction in the implanted region to form an silicon oxide layer using the heat generated by a subsequent polysilicon deposition process or a laser beam. The silicon oxide layer protects the substrate by acting as a buffer, thus preventing the substrate from being over-etched to form a deep trench. Consequently, contact resistance between the buried contact window and the source/drain region is lowered, and leakage current at the junction is prevented.

19 Claims, 4 Drawing Sheets

METHOD OF MANUFACTURING BURIED CONTACT IN SRAM

BACKGROUND OF THE INVENTION

1. Field of Invention

The present invention relates to a method of manufacturing static random access memory (SRAM). More particularly, the present invention relates to a method of manufacturing a buried contact in an SRAM.

2. Description of Related Art

SRAM is one of the fastest operating semiconductor memory devices. Therefore, SRAM has been widely used, for example, in the cache memory of a computer. At present, SRAMs are also used in microcomputers, microprocessors and other digital equipment.

In general, an SRAM integrated circuit can be divided into two regions, namely, a memory cell region and a peripheral circuit region. The memory cell region comprises a large number of memory cell units, each for storing a single bit of data. The peripheral circuit region includes some address decoders for decoding the memory addresses coming from the memory cell region and some memory operating circuits. FIG. 1 is a circuit diagram of a memory unit in the memory cell region of SRAM.

As shown in FIG. 1, an SRAM cell comprises resistors $R_1$ and $R_2$ and MOS transistors $T_1$, $T_2$, $T_3$ and $T_4$. The resistor $R_1$ is connected in series with the MOS transistor $T_1$, while the drain and the source of the MOS transistor $T_1$ are connected to the voltage source $V_{DD}$ and ground $V_{SS}$, respectively. Similarly, The resistor $R_2$ is connected in series with the MOS transistor $T_2$, while the drain and the source of the MOS transistor $T_2$ are connected to the voltage source $V_{DD}$ and ground $V_{SS}$, respectively.

In addition, the gate of the MOS transistor $T_2$, the drain of MOS transistor $T_1$ and the drain of MOS transistor $T_3$ are connected at node point A. Similarly, the gate of the MOS transistor $T_1$, the drain of MOS transistor $T_2$ and the drain of MOS transistor $T_4$ are connected at node point B. The gates of the MOS transistors $T_3$ and $T_4$ are connected to a word line WL, while the sources of the MOS transistor $T_3$ and $T_4$ are connected to the bit line BL and the complementary bit line $\overline{BL}$, respectively. Transistors $T_1$ and $T_2$ act as drivers, and transistors $T_3$ and $T_4$ act as a relays for accessing data. Lastly, the resistor elements $R_1$ and $R_2$ serve as loads.

In general, the contact windows of conventional SRAM are formed mostly above the source/drain regions. However, for integrated circuits having a high level of integration, the conventional method of forming contact windows becomes infeasible. Therefore, a type of contact window known as a buried contact window, which is especially suitable for forming local interconnects, is developed. A buried contact window is capable of reducing wafer occupation. For example, when a buried contact is formed in an SRAM unit, as much as 25% of chip area can be saved. Hence, buried contact windows are preferred in high-density semiconductor products.

FIGS. 2A through 2C are schematic, cross-sectional views showing the progression of steps in producing a buried contact window in SRAM according to the conventional method.

First, as shown in FIG. 2A, a semiconductor substrate 10 is provided. Then, a device isolation structure, for example, a field oxide (FOX) layer 20 is formed above the substrate 10. Next, a gate oxide layer 30 is formed over the substrate 10, and then a first polysilicon layer 40 is deposited over the gate oxide layer 30. Thereafter, a photoresist layer 42 is coated over the first polysilicon layer 40, and then the photoresist layer 42 is patterned. In the subsequent step, the first polysilicon layer 40 and the gate oxide layer 30 are sequentially etched, thereby forming a buried contact window opening 45.

Next, as shown in FIG. 2B, the photoresist layer 42 is removed. Then, a second polysilicon layer 50 and a tungsten suicide layer 60 are sequentially formed over the first polysilicon layer 40 and the buried contact window opening 45.

Next, as shown in FIG. 2C, conventional photolithographic technique is used to pattern out the source/drain region. Thereafter, the tungsten silicide layer 60 and the second polysilicon layer 50 are sequentially etched to form a conductive line 65 and a gate 75. Therefore, between the conductive line 65 and the gate 75, an opening 70 that exposes the surface of the source/drain region 90 is also formed. The opening 70 is purposely formed in a position slightly shifted towards the field oxide layer 20. Furthermore, since the second polysilicon layer 50 and the substrate 10 are made from the same material, a trench 80 as shown in FIG. 2C is also formed in the substrate 10. In addition, thickness of the gate oxide layer **30*d* underneath the opening 70** is also reduced due to etching.

Thereafter, ions are implanted into the substrate at the bottom of the opening 70 using the tungsten silicide layer 60 as a mask, thereby forming doped regions 90 and 100 in the substrate. Since the ions need not strike the substrate perpendicularly, and a trench 80 was formed in a previous etching operation, some ions are trapped in the buried contact window 100 on the left side at the bottom of the opening 70 and next to the source/drain region 90.

In the aforementioned method of forming an opening 70 to the source/drain region 90, a trench 80 is also formed. If the depth of this trench 80 is great, contact area between the buried contact window 100 and the source/drain region 90 will be small. Hence, resistance at the junction increases considerably. Moreover, if the depth of the trench 80 is too deep, there may be a re-direction of current. Instead of passing through the implanted regions 90 and 100, the current flows by way of the substrate 10 and ground, thereby leading to junction leakage.

In light of the foregoing, there is a need a more efficient method of fabrication buried contact window in SRAM.

SUMMARY OF THE INVENTION

Accordingly, the present invention provides a method of manufacturing the buried contact window of SRAM so that the depth of trench within the buried contact window is reduced, and junction leakage can be prevented as well.

To achieve these and other advantages and in accordance with the purpose of the invention, as embodied and broadly described herein, the invention provides a method of manufacturing a buried contact window in an SRAM. The method includes the steps of forming a gate oxide layer over a semiconductor substrate, and then forming a device isolation structure above the substrate. Thereafter, a first polysilicon layer is formed over the gate oxide layer. Then, photolithographic and etching operations are conducted to form a buried contact window opening in the first polysilicon layer and the gate oxide layer.

Next, the contact window opening is patterned again, and then oxygen ions are implanted into the substrate on one side of the desired source/drain location. A second polysilicon layer and a tungsten silicide layer are sequentially formed over the first polysilicon layer and the buried contact window opening. In the process of depositing the second polysilicon layer the high reaction temperature needed to deposit polysilicon is able to transform the oxygen ion implanted region into a silicon oxide layer Thereafter, photolithographic and etching operations are again carried out to form an opening leading to the source/drain region. The opening is located within the tungsten silicide layer and the second polysilicon layer on one side of the previously formed buried contact window opening. In other words, the opening is located between a gate and a conductive line. Since a patch of oxide is formed in the substrate on one side of the source/drain region, the etching selectivity ratio there is increased. Consequently, a trench having a depth less than the conventional depth is formed, thereby avoiding a high resistance at the junction between the buried contact window and the source/drain region or any junction leakage current.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
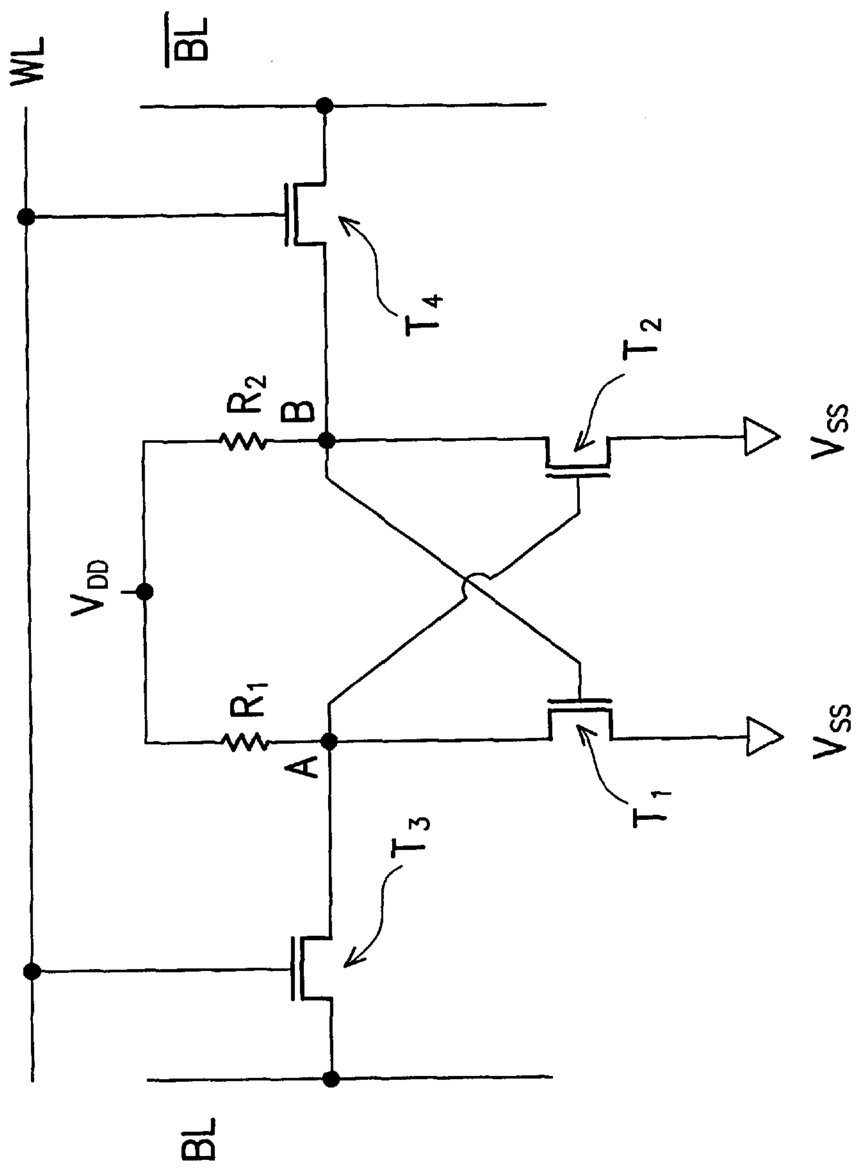
FIG. 1 is a circuit diagram of a memory unit in the memory cell region of SRAM.
Figure 2A:
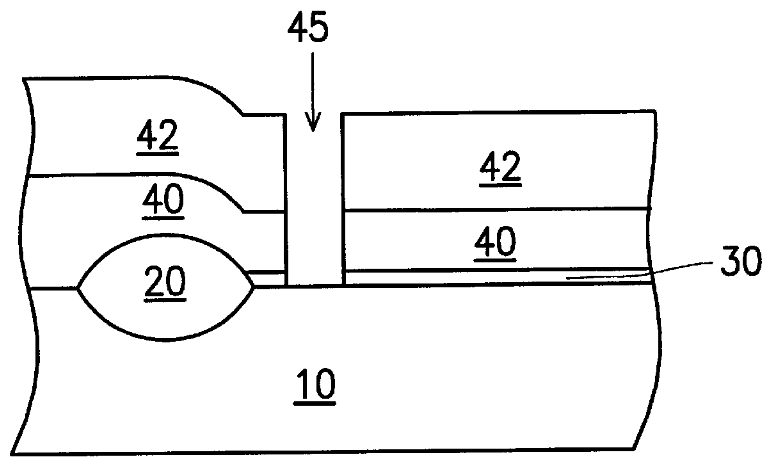
FIGS. 2A through 2C are schematic, cross-sectional views showing the progression of steps in producing a buried contact window in SRAM according to the conventional method.
Figure 2B:
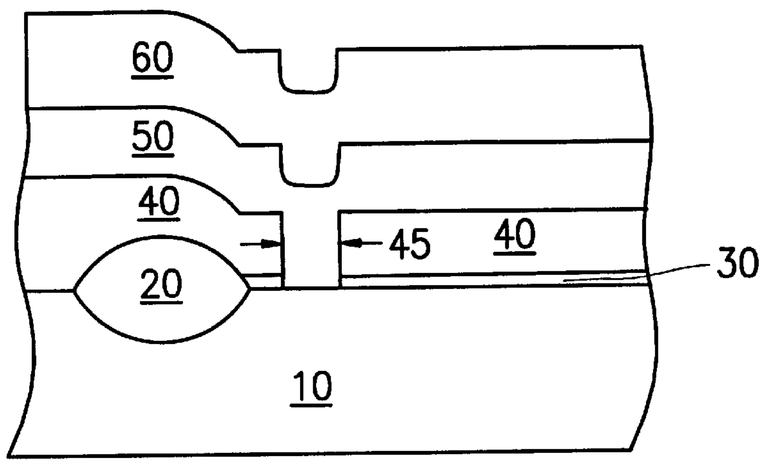
Figure 2C:
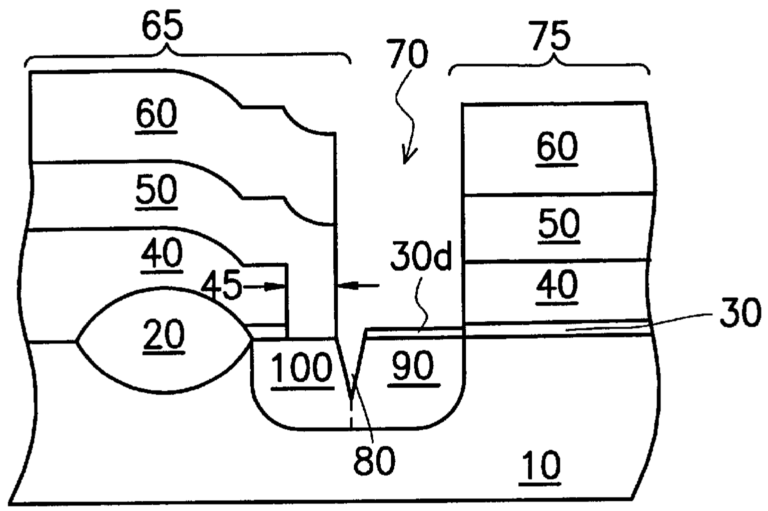

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3D are schematic, cross-sectional views showing the progression of steps in producing a buried contact window in SRAM according to one preferred embodiment of this invention.

Figure 3A:
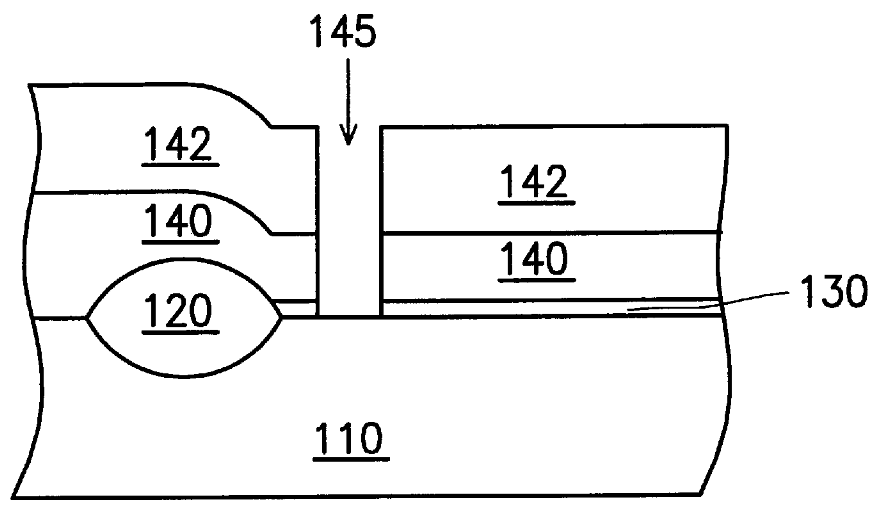
FIGS. 3A through 3D are schematic, cross-sectional views showing the progression of steps in producing a buried contact window in SRAM according to one preferred embodiment of this invention.

As shown in FIG. 3A, a semiconductor substrate 110 is provided. A device isolation structure, for example, a field oxide (FOX) layer 120 is formed above the substrate 110. Thereafter, a gate oxide layer 130 is formed over the substrate 110 using, for example, a thermal oxidation method. The gate oxide layer 130 can be a silicon oxide layer having a thickness of about 100 Å to 250 Å.

In the subsequent step, a first polysilicon layer 140 is formed over the gate oxide layer 130. For example, the first polysilicon layer 140 is deposited by heating to a temperature of between 575° C. to 650° C. using $SiH_4$ as the reactive gas in a low pressure chemical vapor deposition (LPCVD) process. After that, a first layer of photoresist 142 is coated over the first polysilicon layer 140, and then the photoresist layer 142 is patterned. Subsequently, the first polysilicon layer 140 and the gate oxide layer 130 are etched to form a buried contact window opening 145. Finally, the photoresist layer 142 is removed.

Figure 3B:
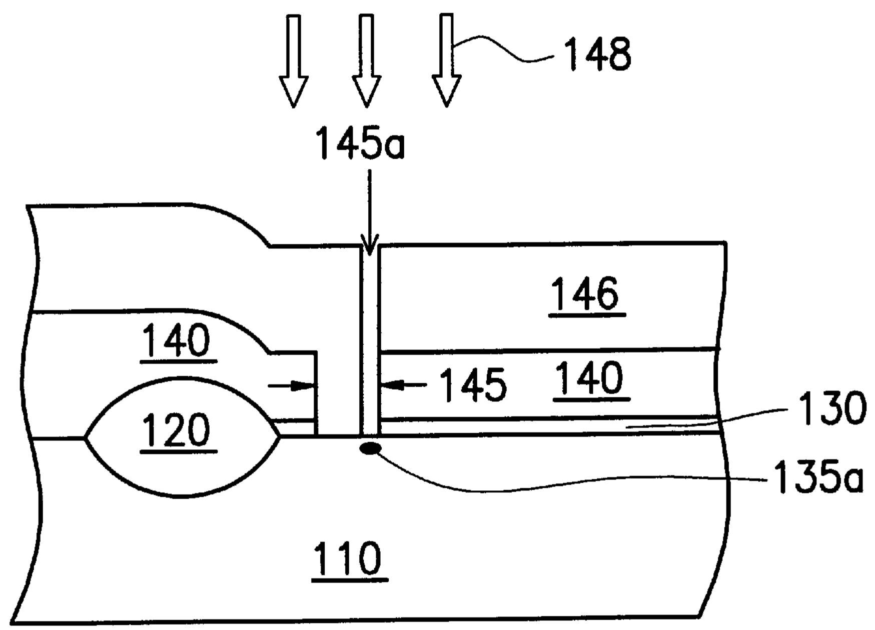

As shown in FIG. 3B, a second layer of photoresist 146 is coated over the first polysilicon layer 140. Then, the photoresist layer 146 is patterned to form a small opening 145*a* occupying only a portion of the buried contact window opening 145. The small opening 145*a* is formed on one side of the desired source/drain location. Thereafter, employing oxygen plasma 148, oxygen ions are implanted into the substrate region 135*a* through the opening 145*a*.

The implanted oxygen ions in the region 135*a* are permitted to react with silicon to form a silicon oxide layer. The silicon oxide layer is used as a protective cover protecting against over-etching of the substrate to form a deep trench when an opening leading to the source/drain region is later formed. The implanted oxygen ions in the region 135*a* can react with silicon utilizing the high temperature of a subsequent polysilicon deposition.

Alternatively, the region 135*a* can be exposed to a laser beam to hasten the reaction between silicon and oxygen to form a silicon oxide layer. It is of note that oxygen ions are implanted into the bottom of the opening 145*a* instead of the bottom of the whole buried contact window opening 145. This is because subsequently deposited conductive material can form a good electrical contact with the contact window surface only if there is an undoped region.

Figure 3C:
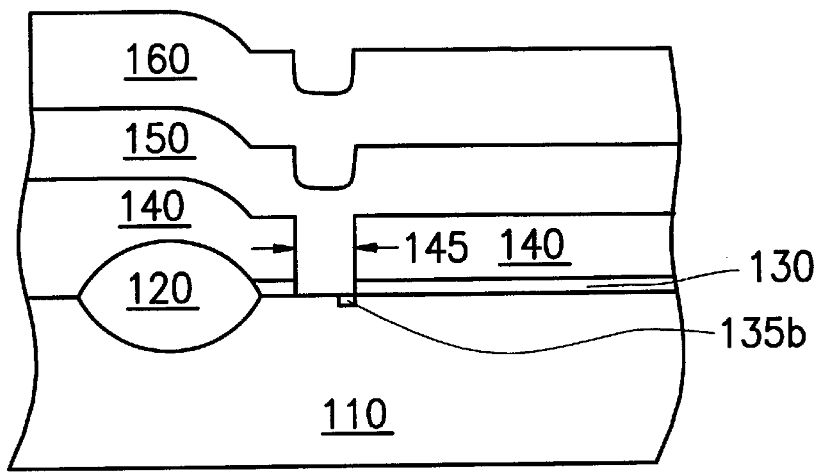

As shown in FIG. 3C, the photoresist layer 146 is removed. After that, a second polysilicon layer 150 and a tungsten silicide layer 160 are sequentially formed over the first polysilicon layer 140 and the buried contact window opening 145. The implanted oxygen ions in region 135*a* will be transformed into a local oxide region 135*b* after a laser beam is applied to that area, or when the second polysilicon layer 150 is deposited at a high temperature. Hence, a portion of the substrate surface is protected. The tungsten silicide is deposited over the second polysilicon layer using WF6 and $SiH_4$ as reactive gases at a temperature of between 300° C. to 400° C. in a LPCVD operation, for example.

Figure 3D:
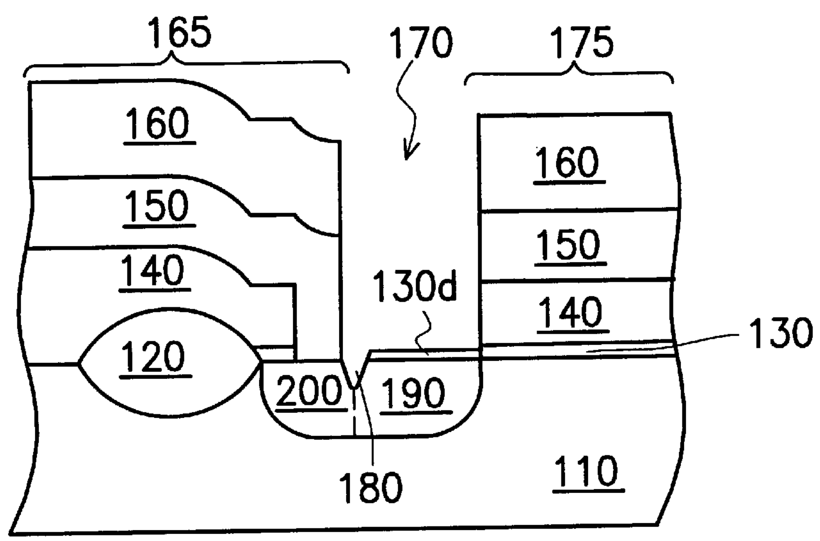

As shown in FIG. 3D, photolithographic and etching operations are carried out to form a conductive line 165 and a gate 175 within the tungsten suicide 160, the second polysilicon layer 150 and the first polysilicon layer 140. Between the conductive line 165 and the gate 175, an opening 170 that leads to a source/drain region and a trench 180 in the substrate 110 are formed. Because of etching, the gate oxide layer 130*d* directly underneath the opening 170 is thinner than the gate oxide layer 130. However, due to the presence of a protective oxide in region 135*b* above the substrate 110, depth of the trench 180 after the etching will be much shallower than a conventional trench. In the subsequent step, ion implantation is carried out using the tungsten silicide layer 160 as a mask to form the ion doped regions including a source/drain region 190 and a buried contact window 200 in the substrate 110.

In summary, the major aspect of this invention includes performing an oxygen ion implant in a portion of the buried contact window opening. Then, using the heat in a subsequent polysilicon deposition operation or a laser beam, an oxidation reaction is initiated, thereby forming a protective oxide layer over the substrate. Therefore, when various overlying layers are etched to form an opening that leads directly to the source/drain region, the oxide layer can serve as a buffer region preventing the formation of a deep trench.

Therefore, the invention is capable of reducing the depth of trench located in the buried contact window region, and hence is able to reduce contact resistance between the buried contact window and the source/drain region or any leakage current at the junction.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a buried contact window of an SRAM, comprising the steps of:

providing a substrate, wherein the substrate has a device isolation structure;

forming an oxide layer and a first conductive layer over the substrate;

patterning the first conductive layer to form a first opening in a buried contact window region, wherein the first opening exposes the substrate in the buried contact window region;

patterning an area within the buried contact window region adjacent to one side of a desired source/drain region, and then performing a first ion implantation in that area;

forming a second conductive layer, wherein the second conductive layer connects electrically with the substrate through the first opening;

patterning the second conductive layer to form a conductive line and a gate together with a second opening between the conductive line and the gate such that the second opening exposes the desired source/drain region and a portion of the buried ion-doped contact window region; and performing a second ion implantation implanting ions into the substrate through the second opening to form a buried contact window and a source/drain region.

2. The method of claim 1, wherein the step of forming the first conductive layer includes depositing polysilicon to form a polysilicon layer.

3. The method of claim 2, wherein the step of forming the polysilicon layer includes low pressure chemical vapor deposition using $SiH_4$ as gaseous reactant at a temperature of roughly between 575° C. to 650° C.

4. The method of claim 1, wherein the step of forming the second conductive layer includes depositing polysilicon and tungsten silicide.

5. The method of claim 4, wherein the step of forming the polysilicon layer includes low pressure chemical vapor deposition using $SiH_4$ as gaseous reactant at a temperature of roughly between 575° C. to 650° C.

6. The method of claim 4, wherein the step of forming the tungsten silicide layer includes low pressure chemical vapor deposition using $WF_6$ and $SiH_4$ as gaseous reactants at a temperature of roughly between 300° C. to 400° C.

7. The method of claim 1, wherein the first ion implantation includes implanting oxygen ions.

8. The method of claim 7, wherein after the step of implanting oxygen ions into the substrate, further includes using a laser beam to heat the implanted region locally so that the oxygen ions can react with silicon to form a silicon oxide layer.

9. The method of claim 7, wherein after the step of implanting oxygen ions into the substrate, further includes using the heat generated during the deposition of the second conductive layer to activate the reaction between the implanted oxygen ions and silicon for the production of a silicon oxide layer.

10. A method of manufacturing a buried contact window of an SRAM, comprising the steps of:

providing a substrate, wherein the substrate has a device isolation structure;

forming an oxide layer and a first conductive layer over the substrate;

patterning the first conductive layer to form a first opening in a buried contact window region, wherein the first opening exposes the substrate in the buried contact window region;

patterning an area within the buried contact window region located to one side of a desired source/drain region, and then performing a first ion implantation in that area;

forming a second conductive layer, wherein the second conductive layer connects electrically with the substrate through the first opening;

patterning the second conductive layer to form a conductive line and a gate together with a second opening located between the conductive line and the gate such that the second opening exposes the desired source/drain region and a portion of the buried ion-doped contact window region.

11. The method of claim 10, wherein the step of forming the first conductive layer includes depositing polysilicon to form a polysilicon layer.

12. The method of claim 1, wherein the step of forming the polysilicon layer includes low pressure chemical vapor deposition using $SiH_4$ as gaseous reactant at a temperature of roughly between 575° C. to 650° C.

13. The method of claim 10, wherein the step of forming the second conductive layer includes depositing polysilicon and tungsten silicide.

14. The method of claim 13, wherein the step of forming the polysilicon layer includes low pressure chemical vapor deposition using $SiH_4$ as gaseous reactant at a temperature of roughly between 575° C. to 650° C.

15. The method of claim 13, wherein the step of forming the tungsten silicide layer includes low pressure chemical vapor deposition using $WF_6$ and $SiH_4$ as gaseous reactants at a temperature of roughly between 300° C. to 400° C.

16. The method of claim 10, wherein the first ion implantation includes implanting oxygen ions.

17. The method of claim 16, wherein after the step of implanting oxygen ions into the substrate, further includes using a laser beam to heat the implanted region locally so that the oxygen ions can react with silicon to form a silicon oxide layer.

18. The method of claim 16, wherein after the step of implanting oxygen ions into the substrate, further includes using the heat generated during the deposition of the second conductive layer to activate the reaction between the implanted oxygen ions and silicon for the production of a silicon oxide layer.

19. The method of claim 10, wherein after the step of forming the second opening, further includes the steps of performing a second ion implantation implanting ions into the substrate through the second opening to form a buried contact window and a source/drain region.

* * * * *